United States Patent
Murakuki (10) Patent No.: US 6,525,956 B2
(45) Date of Patent: Feb. 25, 2003

(54) FERROELECTRIC CAPACITOR MEMORY

(75) Inventor: Yasuo Murakuki, Kyotanabe (JP)

(73) Assignee: Matsushita Electric Industrial Co., Ltd. (JP)

( * ) Notice: Subject to any disclaimer, the term of this patent is extended or adjusted under 35 U.S.C. 154(b) by 0 days.

(21) Appl. No.: 09/905,111

(22) Filed: Jul. 16, 2001

(65) Prior Publication Data

US 2002/0006053 A1 Jan. 17, 2002

(30) Foreign Application Priority Data

Jul. 17, 2000 (JP) .................................. 2000-215264

(51) Int. Cl.[7] .............................................. G11C 11/22
(52) U.S. Cl. ...................................... 365/145; 365/203
(58) Field of Search .............................. 365/145, 203, 365/129, 189.01

(56) References Cited

U.S. PATENT DOCUMENTS

| | | | |
|---|---|---|---|
| 5,579,257 A | | 11/1996 | Tai |
| 5,828,615 A | * | 10/1998 | Mukunoki et al. .......... 365/145 |
| 6,034,884 A | * | 3/2000 | Jung .......................... 365/145 |

* cited by examiner

*Primary Examiner*—Hoai Ho
(74) *Attorney, Agent, or Firm*—Parkhurst & Wendel, L.L.P.

(57) ABSTRACT

Data can be read from a ferroelectric memory cell with stability in the event of deterioration on a ferroelectric constituting the memory cell. A pair of precharge transistors precharges a selected bit line BL/XBL to a second potential VDD. After a while, a word line selector activates a word line WL, a current mirror amplifier amplifies a difference in current, which is applied to the pair of precharge transistors, to a sub bit line SBL/XSBL, and data is read from the ferroelectric memory cell.

10 Claims, 11 Drawing Sheets

FERROELECTRIC CAPACITOR MEMORY

TECHNICAL FIELD

The present invention relates to a non-volatile ferroelectric memory for storing data by using characteristics of a ferrorelectric capacitor.

BACKGROUND ART

A non-volatile memory being capable of keeping data after the power is turned off has been achieved in recent years by using a ferroelectric material such as PZT as well that shows hysteresis characteristics. Namely, such a non-volatile memory is embodied with a simple configuration by using a ferroelectric material for a memory cell. A nonvolatility is exhibited by the characteristics of a ferroelectric capacitor, which is made of a ferroelectric material, to store digital data.

A ferroelectric RAM (FeRAM: Ferroelectric Random Access Memory) using such a non-volatile memory has the above non-volatile characteristics with a simple configuration and can perform a high-speed operation at a low voltage. Thus, the FeRAM has attracted interest as a ferroelectric memory from a number of memory chip manufacturers.

An operating speed of the FeRAM is determined by polarization inversion time of the ferroelectric capacitor. The polarization inversion time of the ferroelectric capacitor is determined by a capacitor area, a thickness of the ferroelectric thin film, an applied voltage, and so on. The polarization inversion time is normally indicated in ns.

The above-mentioned conventional ferroelectric memory will be described.

Figure 7:
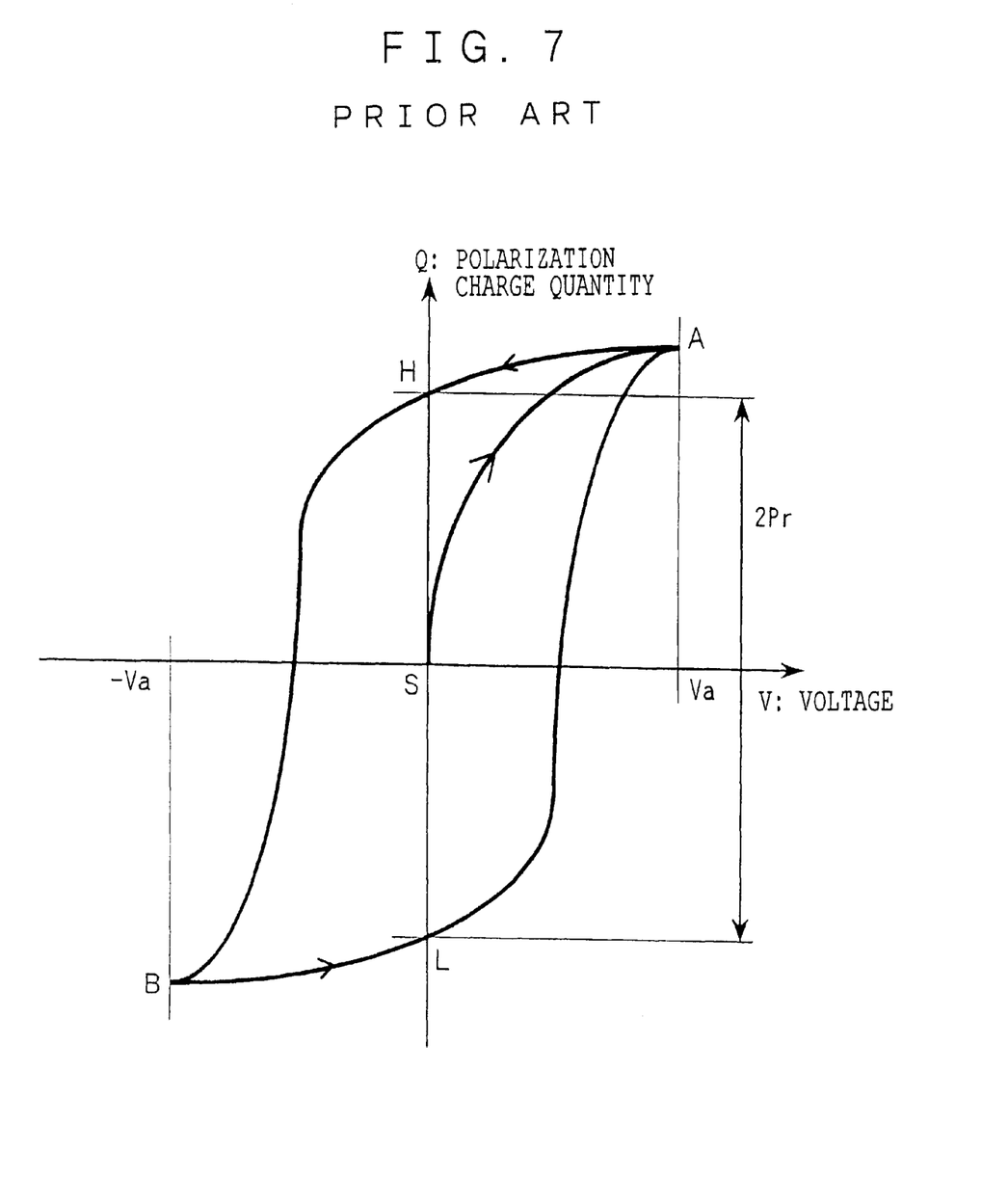
FIG. 7 is an explanatory drawing showing polarization characteristics of a ferroelectric capacitor in a conventional ferroelectric memory.

FIG. 7 is an explanatory drawing showing polarization characteristics of the ferroelectric capacitor in the conventional ferroelectric memory. FIG. 7 also shows a hysteresis loop of the ferroelectric capacitor. A vertical axis indicates a charge quantity, which is induced on a surface of a ferroelectric by spontaneous polarization of the ferroelectric, that is, a polarization quantity [C]. A horizontal axis indicates a voltage [V] applied to the ferroelectric capacitor.

When a positive voltage is applied to the ferroelectric while the ferroelectric capacitor has an inter-terminal voltage of 0 and polarization does not occur, a polarization quantity increases from S to A in FIG. 7. The ferroelectric does not increase in polarization quantity at a certain voltage (electric field) or more. Namely, a polarization quantity reaches a maximum value at point A.

Inclination at this point is defined as (Cs=dq/dV) where Cs represents a parallel plate capacitance component. Thereafter, even when an inter-terminal voltage of the ferroelectric capacitor is set at 0, a polarization quantity is not set at 0 but stays at H. Pr[C] represents a polarization charge quantity stored at this moment. This characteristic is used to form a non-volatile memory.

Figure 9:
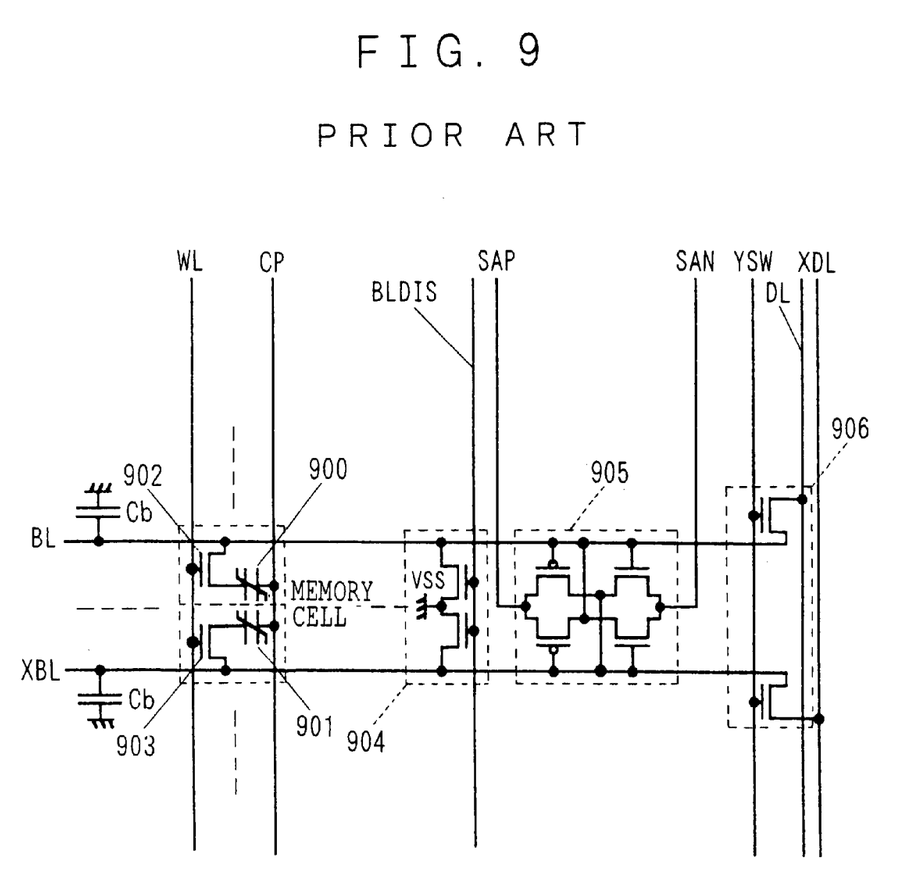
FIG. 9 is a circuit diagram showing a configuration of a ferroelectric memory of the conventional art.

FIG. 9 is a circuit diagram showing the configuration of a ferroelectric memory including a typical 2T-type (2 transistors) 2C-type (2 capacitors) memory cell. In FIG. 9, reference character WL denotes a word line, reference characters BL and XBL denote bit lines, reference numerals 900 and 901 denote ferroelectric capacitors, reference numerals 902 and 903 denote selective transistors, reference numeral 904 denotes a transistor for pre-charging the bit lines BL and XBL to a VSS level, reference numeral 905 denotes an amplifier for amplifying a potential difference between the bit lines BL and XBL, reference numeral 906 denotes a an transistor for selectively connecting the bit lines BL and XBL and data lines DL and XDL, and reference character Cb denotes a parasitic capacitance of the bit lines BL and XBL.

Figure 10:
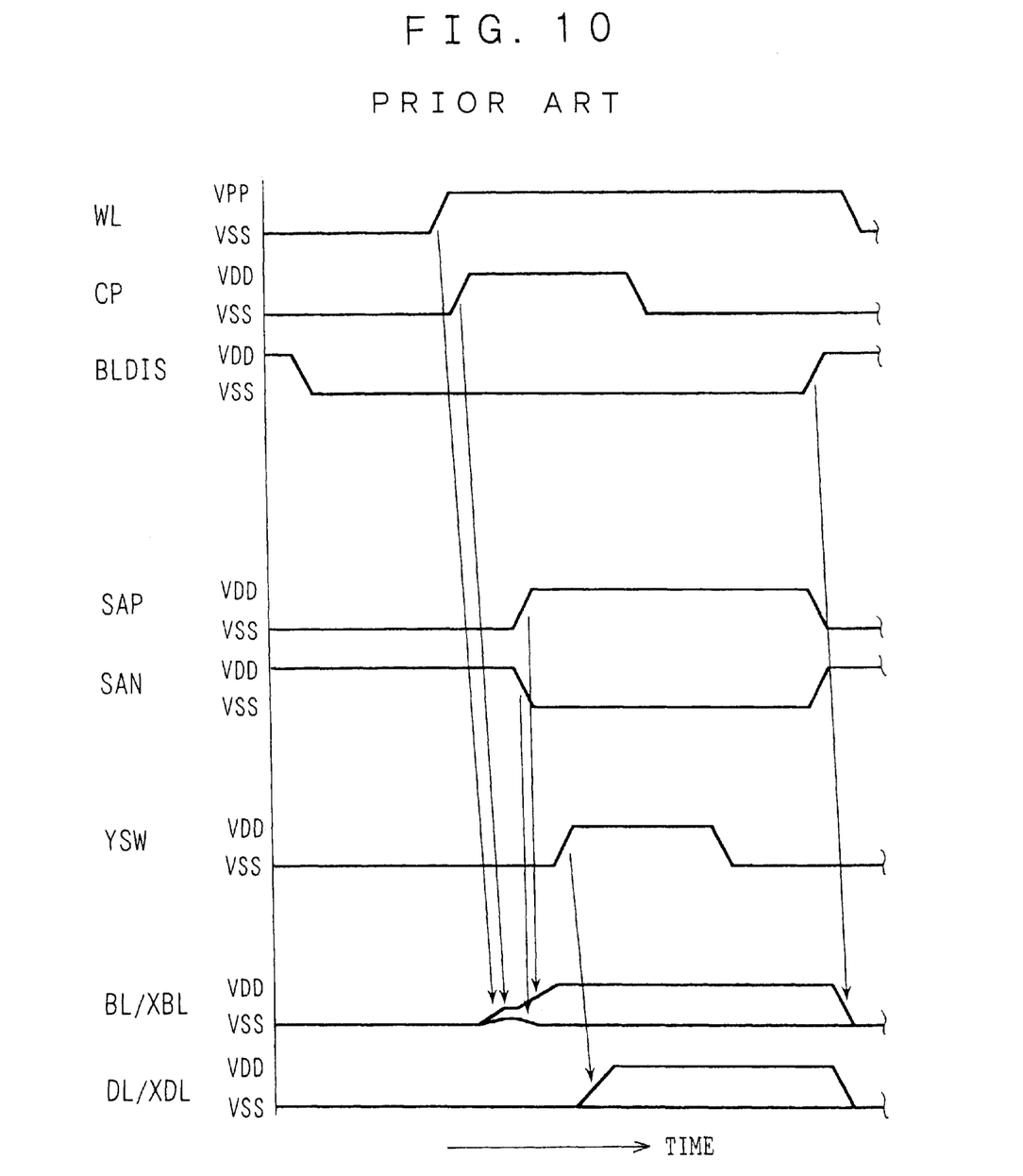
FIG. 10 is a timing chart showing a reading operation of the conventional art.

Referring to a timing chart of FIG. 10, the following will discuss an operation of reading data from the ferroelectric memory having the above configuration.

BLDIS is deactivated to set the bit line BL/XBL to a floating state, the word line WL is activated at a VPP level, which is higher than a source voltage VDD, a memory cell is selected, and a cell plate line CP is activated. Thus, a voltage VDD is applied to the ferrorelectric capacitors 900 and 901. It is assumed that the memory cell 900 stores Hi data and the memory cell 901 stores Low data. Further, a potential Vbl and Vxbl of the bit line BL/XBL and a potential difference Vdif of the bit line BL/XBL are approximately indicated by the following equation.

$$Vbl=VDD/(Cb/Cs+1)$$

$$Vxbl=VDD/(Cb/Cs+1)+(2Pr/Cs)/(Cb/Cs+1)$$

$$Vdif=Vxbl-Vbl=(2Pr/Cs)/(Cb/Cs+1) \quad (1)$$

Subsequently, SAP is activated while SAN is deactivated to activate a sense amplifier, and a bit line potential is amplified. YSW is activated to transfer information of the bit line BL/XBL to the data line DL/XDL. Next, the cell plate line CP is deactivated to rewrite Low data of the memory cell 901, YSW is deactivated, SAP is deactivated, SAN is activated, the sense amplifier is deactivated, and BLDIS is activated to pre-charge the bit line BL/XBL to a VSS level. After the bit line BL/XBL is pre-charged to a VSS level, the word line WL is deactivated and the reading cycle is completed.

In Equation (1), a reading potential increases as a parasitic capacitance Cb decreases. However in reality, its polarization charge quantity Pr[C] reduces a bit line potential of a floating state, a voltage is not sufficiently applied to the ferroelectric capacitors, and a polarization charge quantity for writing cannot be taken out from the memory cell.

Moreover, in the case where 2Pr is raised according to an increased area of the ferroelectric capacitor and a thinner film of the ferroelectric, Cs also increases and a voltage applied to the ferroelectric capacitor is reduced as mentioned above. Consequently, a polarization charge quantity for writing cannot be taken out from the memory cell.

Figure 8:
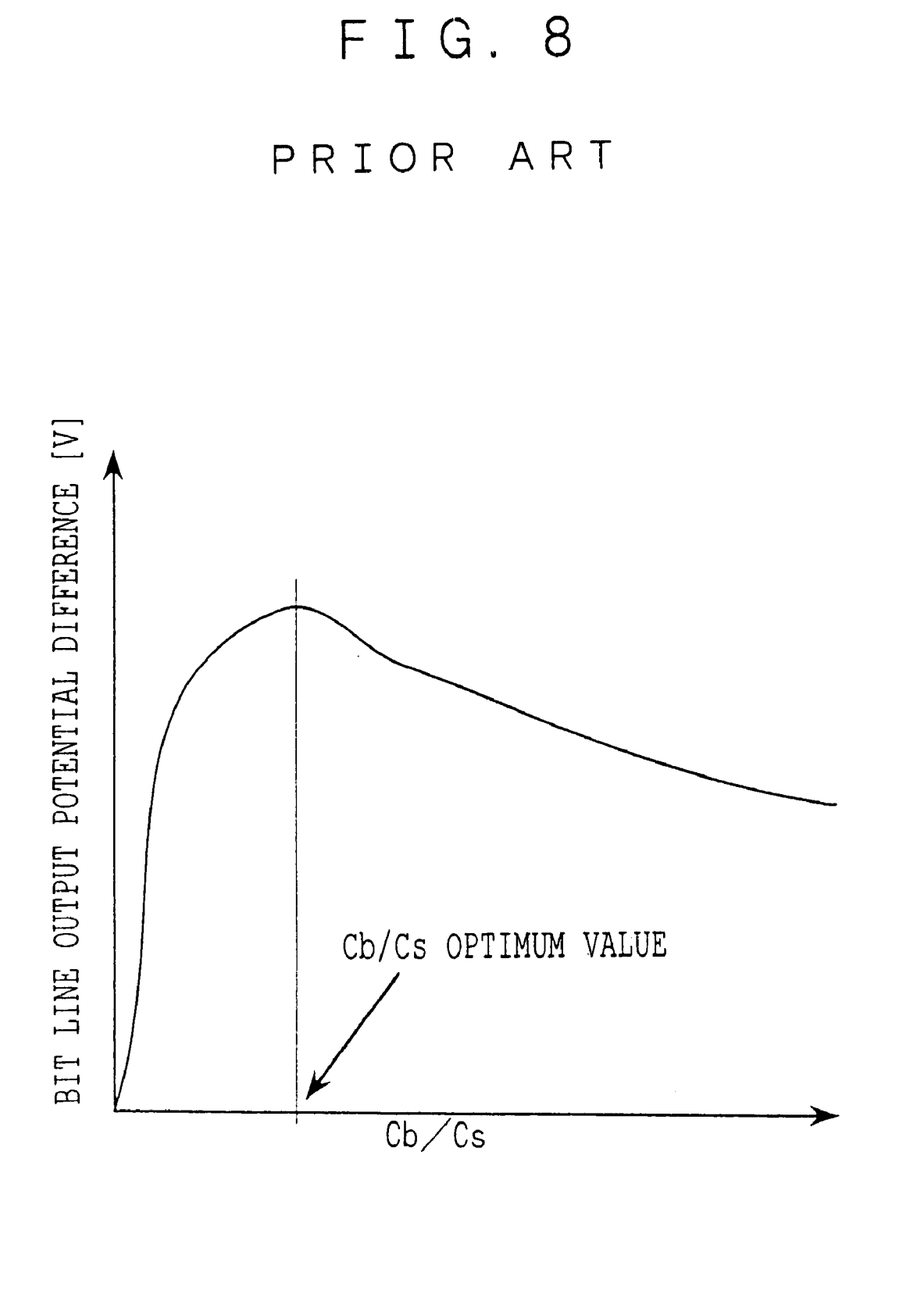
FIG. 8 is an explanatory drawing showing a relationship between a bit line reading potential difference and Cb/Cs of the conventional art.

Therefore, a reading potential difference of the bit line BL/XBL is given a peak value by Cb/Cs. The relationship between a bit line output potential difference [V] and Cb/Cs is shown in FIG. 8.

Also, a polarization charge quantity 2Pr of the ferroelectric is reduced by deterioration of the ferroelectric. Hence, even when Cb/Cs is set to maximize a reading potential of the bit line BL/XBL, a problem occurs on reliability because 2Pr is reduced by deterioration of the ferroelectric, a reading potential difference to the bit line BL/XBL decreases, and reading failure is likely to occur.

As described above, the conventional ferroelectric memory requires a sufficient reading margin to positively read data during the reading operation. Even if a capacitor area is simply increased, it is difficult to completely take out a charge quantity, which has been stored in the ferroelectric upon writing, during the reading operation, resulting in a limit on an obtained reading margin.

Additionally, even when Cb/Cs is set to maximize a bit line reading potential difference, 2Pr is reduced by deterioration of the ferroelectric, Cb/Cs is varied from an optimum value, a reading potential difference of the bit line is reduced largely, reading failure is more likely to occur, and data cannot be read from the ferroelectric memory cell with stability, resulting in a less reliable device.

DISCLOSURE OF THE INVENTION

The present invention is achieved to solve the above-mentioned problems. A ferroelectric memory is provided, by which data can be read from a ferroelectric memory cell with stability in the event of deterioration on ferroelectric forming the memory cell, the data can be positively read from the ferroelectric memory cell even if a ferroelectric capacitor has a small Cb/Cs, and the reliability of the device is thus improved.

In order to solve the above-mentioned problems, the ferroelectric memory of the present invention, which uses an electric-holding characteristic of the ferroelectric capacitor and stores digital data with the ferroelectric capacitor serving as a memory device, is provided with the ferroelectric capacitor and a selective transistor for selecting the capacitor, the ferroelectric memory further including a ferroelectric memory cell in which the drain or the source of the selective transistor is connected to one of the terminals of the ferroelectric capacitor, a word line connected to the gate of the selective transistor, a bit line connected to the drain or the source of the selective transistor, the drain or the source not being connected to the ferroelectric capacitor, a cell plate line connected to the other terminal of the ferroelectric capacitor, a first precharge transistor for precharging the bit line to a first potential, a second precharge transistor for precharging the bit line to a second potential, amplifying means for sensing and amplifying precharge current of the second precharge transistor, and means for precharging the bit line, which is connected to the ferroelectric memory cell, to the second potential by using the second precharge transistor while the word line selects the ferroelectric memory cell where the data is read, for determining a level state of the ferroelectric capacitor in the ferroelectric memory cell based on a current amplified by the amplifying means according to a precharge current at that time, and for reading data of the ferroelectric memory cell that corresponds to the level state.

According to the ferroelectric memory of the present invention, the second precharge transistor precharges the bit line to the second potential before the word line selects the ferroelectric memory cell, the word line selects the ferroelectric memory cell after a while, and the amplifying means amplifies, based on the selection, a current applied to the ferroelectric memory cell from the bit line which is precharged to the second potential.

According to the ferroelectric memory of the present invention, the amplifying means used for precharge current of the second precharge transistor is a complementary current mirror amplifier.

According to the ferroelectric memory of the present invention, the amplifying means used for precharge current of the second precharge transistor is a complementary current mirror amplifier with a mirror ratio other than 1.

According to the ferroelectric memory of the present invention, the amplifying means used for precharge current of the second precharge transistor is a current mirror amplifier.

According to the ferroelectric memory of the present invention, the amplifying means used for precharge current of the second precharge transistor is a current mirror amplifier with a mirror ratio other than 1.

The ferroelectric memory of the present invention is provided with a sub bit line where an amplified current is applied from the amplifying means, and a second amplifier for amplifying current of the sub bit line.

According to the ferroelectric memory of the present invention, the amplifying means used for precharge current of the second precharge transistor is a current mirror amplifier, there are provided data lines selectively connected to a plurality of bit lines and a second amplifier for amplifying a potential or a current of the data line, the drain of the transistor constituting the current mirror amplifier is connected to the data line, and the second amplifier is provided for each of the data lines.

According to the ferroelectric memory of the present invention, the second precharge transistor is composed of a PMOS transistor whose gate and drain are connected to the bit lines and whose source is connected to a source voltage. According to the ferroelectric memory of the present invention, the second precharge transistor is composed of a PMOS transistor whose gate and drain are connected to the bit lines and whose source is connected to a third potential higher than a source voltage.

According to the ferroelectric memory of the present invention, the second precharge transistor is composed of an NMOS transistor whose gate and drain are connected to the bit lines and whose source is connected to a ground potential.

According to the ferroelectric memory of the present invention, the second precharge transistor is composed of an NMOS transistor whose gate and drain are connected to the bit lines and whose source is connected to a fourth potential lower than a ground potential.

According to the ferroelectric memory of the present invention, the word line selects a ferroelectric memory cell for reading and a ferroelectric memory cell for reference, a bit line pair connected to the selected memory cell is precharged to the second potential by the corresponding second precharge transistor, a level state of the ferroelectric capacitor in the ferroelectric memory cell is determined based on a current difference of the second precharge transistor pair that is amplified by the amplifying means, and data corresponding to the level state is read from the ferroelectric memory cell.

The ferroelectric memory of the present invention uses a capacitor made of a dielectric material other than ferroelectric as the ferroelectric memory cell for reference.

According to the ferroelectric memory of the present invention, inversion data of the ferroelectric memory cell for reading is written into the ferroelectric capacitor of the ferroelectric memory cell for reference.

According to the above configuration, since amplification is performed on a difference in current applied from the bit line to the ferroelectric capacitor, it is possible to read a maximum polarization charge quantity from the ferroelectric memory cell regardless of a parallel plate capacitance component (Cs) of the ferroelectric capacitor, thereby remarkably increasing a reading margin for a reading operation.

Further, it is possible to select a memory core having a high degree of freedom of design without dependence on a bit line parasitic capacitance component (Cb)/Cs of the ferroelectric capacitor, and an embedded ferroelectric memory core can be obtained with a high degree of freedom of design.

DESCRIPTION OF THE EMBODIMENT

Referring to drawings, a ferroelectric memory will be concretely described in a specific manner according to an embodiment of the present invention.
(Embodiment 1)

The following will discuss a ferroelectric memory according to Embodiment 1 of the present invention.

Figure 1:
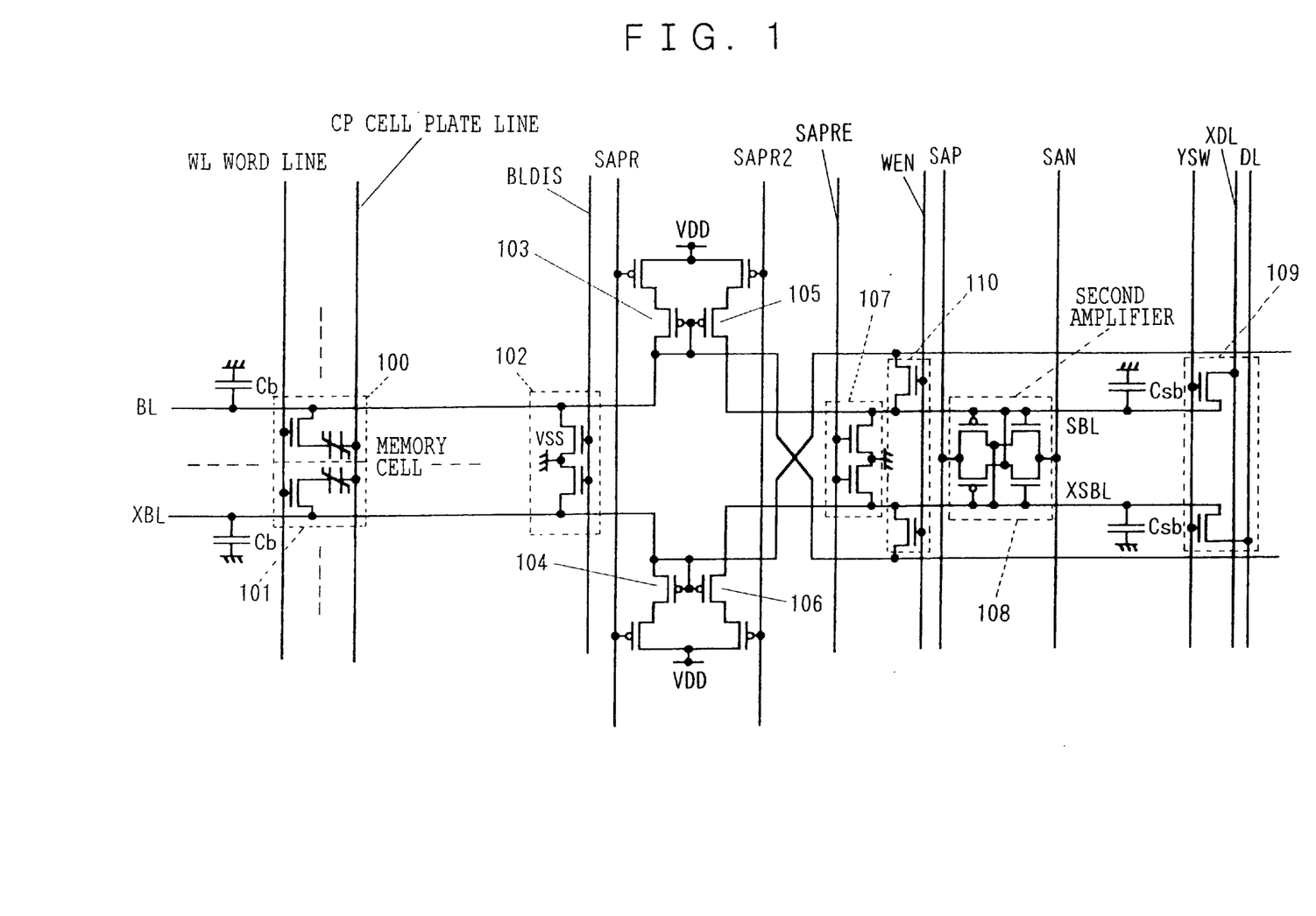
FIG. 1 is a circuit diagram showing a configuration of a ferroelectric memory according to Embodiment 1 of the present invention.

FIG. 1 is a circuit diagram showing an example of a configuration of a reading circuit in the ferroelectric memory of Embodiment 1. In FIG. 1, reference numerals 100 and 101 denote 2T2C (2 transistors, 2 capacitors) memory cells, reference character WL denotes a word line, reference characters BL and XBL denote bit lines, reference numeral 102 denotes a transistor for precharging the bit lines BL and XBL to VSS, reference numerals 103 and 104 denote precharge transistors, reference numerals 105 and 106 denote current mirrors, reference characters SBL and XSBL denote sub bit lines, reference numeral 107 denotes a transistor for precharging the sub bit lines SBL and XSBL to VSS, reference numeral 108 denotes a second amplifier for amplifying the sub bit lines SBL and XSBL, reference numeral 109 denotes a bit line selecting switch, reference numeral 110 denotes a bit line writing transistor, and Cb and Csb are each parasitic capacitance of the bit lines BL and XBL and the sub bit lines SBL and XSBL.

Regarding the ferroelectric memory having the above configuration, the reading operation will be discussed.

Figure 2:
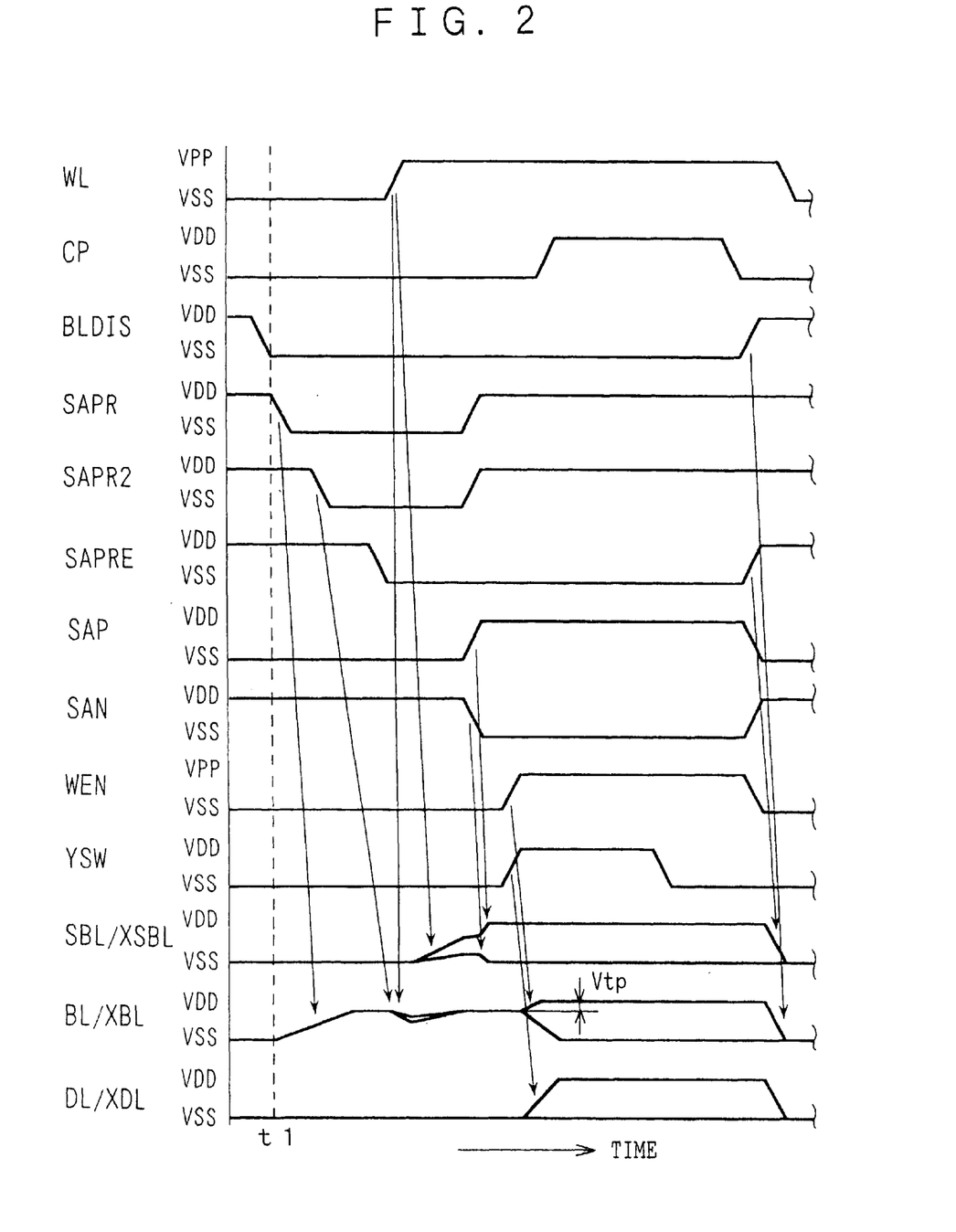
FIG. 2 is a timing chart showing a reading operation of Embodiment 1.

FIG. 2 is a timing chart of the reading operation in the ferroelectric memory of Embodiment 1.

BLDIS is deactivated at a timing of time t1, the bit line BL/XBL is brought to a floating state, and SAPR is deactivated to precharge the bit line to a (VDD−Vtp) level (herein, Vtp represents a threshold voltage of a PMOS transistor). After precharging the bit line, SAPR2 is deactivated, the current mirrors 105 and 106 are activated, and SAPRE is deactivated to bring the sub bit lines SBL/XSBL to a floating state. When WL is activated to a VPP level, the memory cell is selected. CP is at a VSS level at this moment, and a voltage (VDD−Vtp) of the bit line is applied to the ferroelectric capacitor.

It is assumed that the memory cell 100 stores Hi data and the memory cell 101 stores Low data. A charge quantity of {Cs*(VDD−Vtp)} is applied as charge current to the pre-charge transistor 103 because the memory cell 100 stores Hi data.

Meanwhile, a charge quantity of {2Pr+Cs*(VDD−Vtp)} is applied as charge current to the pre-charge transistor 104 because the memory cell 101 performs a polarization inverting operation. Thus, a current is applied to the activated current mirrors 105 and 106 according to a mirror ration (n>0), and a potential of the sub bit line is represented by the following equations.

$$Vsb = n*\{Cs*(VDD-Vtp)\}/Csb$$

$$Vxsb = n*\{2Pr+Cs*(VDD-Vtp)\}/Csb$$

A potential difference of the sub bit lines is represented by the following equation.

$$Vdif = 2Pr/Csb$$

Csb and a mirror ratio are determined so as to satisfy (Vxsb ≦ VDD) at this moment.

And then, SAPR and SAPR2 are activated, the precharge transistors 103 and 104 and the current mirrors 105 and 106 are deactivated. SAP is activated and SAN is deactivated. Thus, the second amplifier 108 is activated and a sub bit line potential is amplified. The cell plate line CP is activated to a VDD level and WEN is activated to a VPP level, so that rewriting to the bit line is carried out. YSW is activated and reading data is outputted to the data line DL/XDL.

Additionally, since Hi data of the memory cell 100 is not corrupted, rewriting is not necessary. Low data is rewritten to the memory cell 101, in which destructive reading occurs together with polarization inversion. When the output to the data line is completed after a desired period, YSW is deactivated.

And then, CP is deactivated to complete rewriting, SAP is deactivated, SAN is activated, and the second amplifier is deactivated, SAPRE is activated to precharge SBL and XSBL to a VSS level. WEN is deactivated, BLDIS is activated, and the bit line is precharged to a VSS level. After the bit line is precharged to a VSS level, the reading cycle is completed when WL is deactivated.

Figure 11:
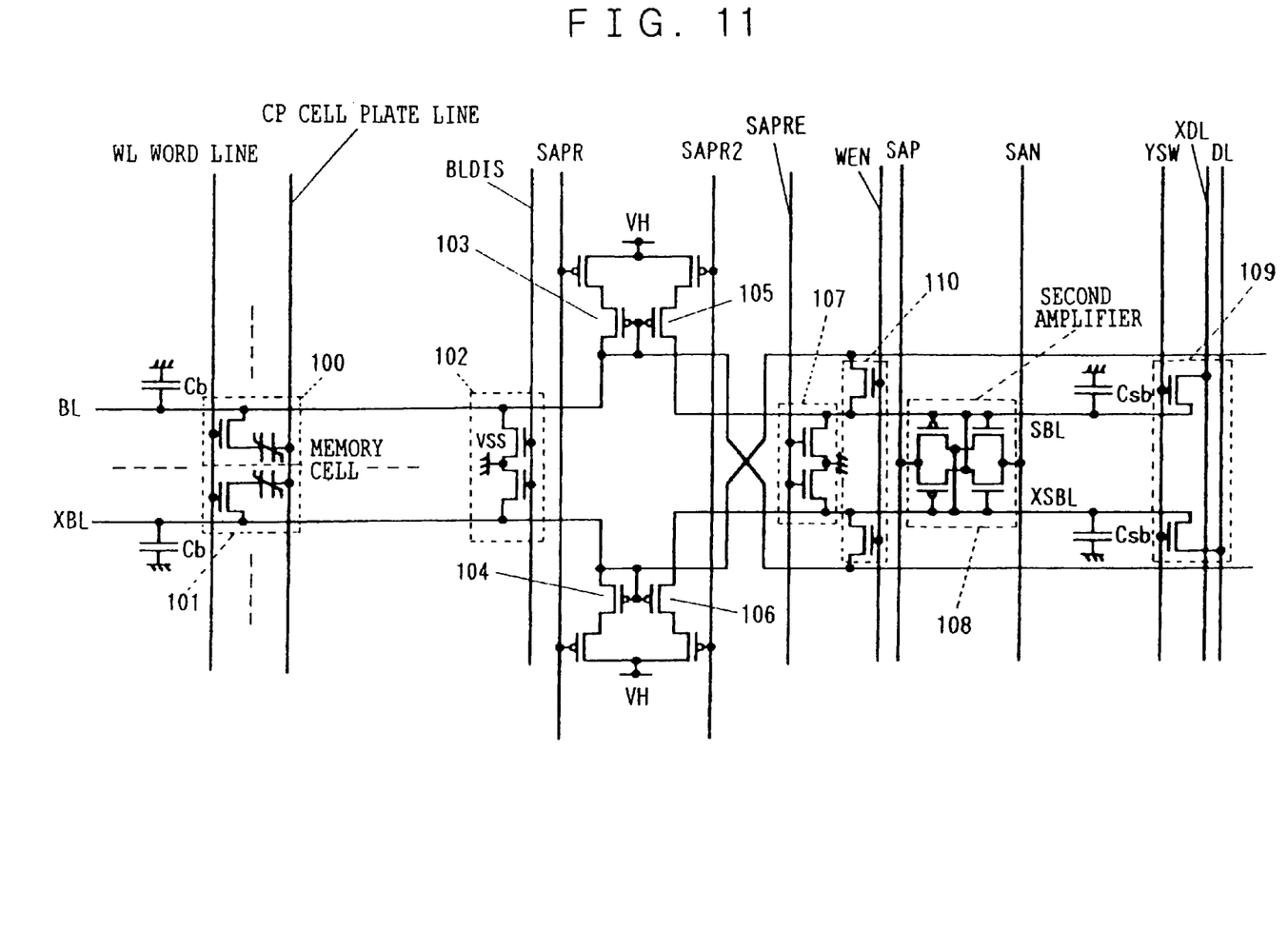
FIG. 11 is a circuit diagram of another embodiment of the circuit of FIG. 1, wherein "VDD" is replaced by "VH."

In Embodiment 1, the precharge transistors 103 and 104 and the current mirrors 105 and 106 are driven at VDD. Hence, a voltage applied to the ferroelectric capacitor is (VDD−Vtp). At the above precharge voltage, when an electric field applied to the ferroelectric capacitor is weaker than a coercive electric field, the precharge transistors 103 and 104 and the current mirrors 105 and 106 are driven at a third potential VH higher than VDD, as shown in FIG. 11, and the third potential VH is set so as to apply a voltage higher than (±Va) of FIG. 7 to the ferroelectric capacitor.
(Embodiment 2)

The following will discuss a ferroelectric memory according to Embodiment 2 of the present invention.

Figure 3:
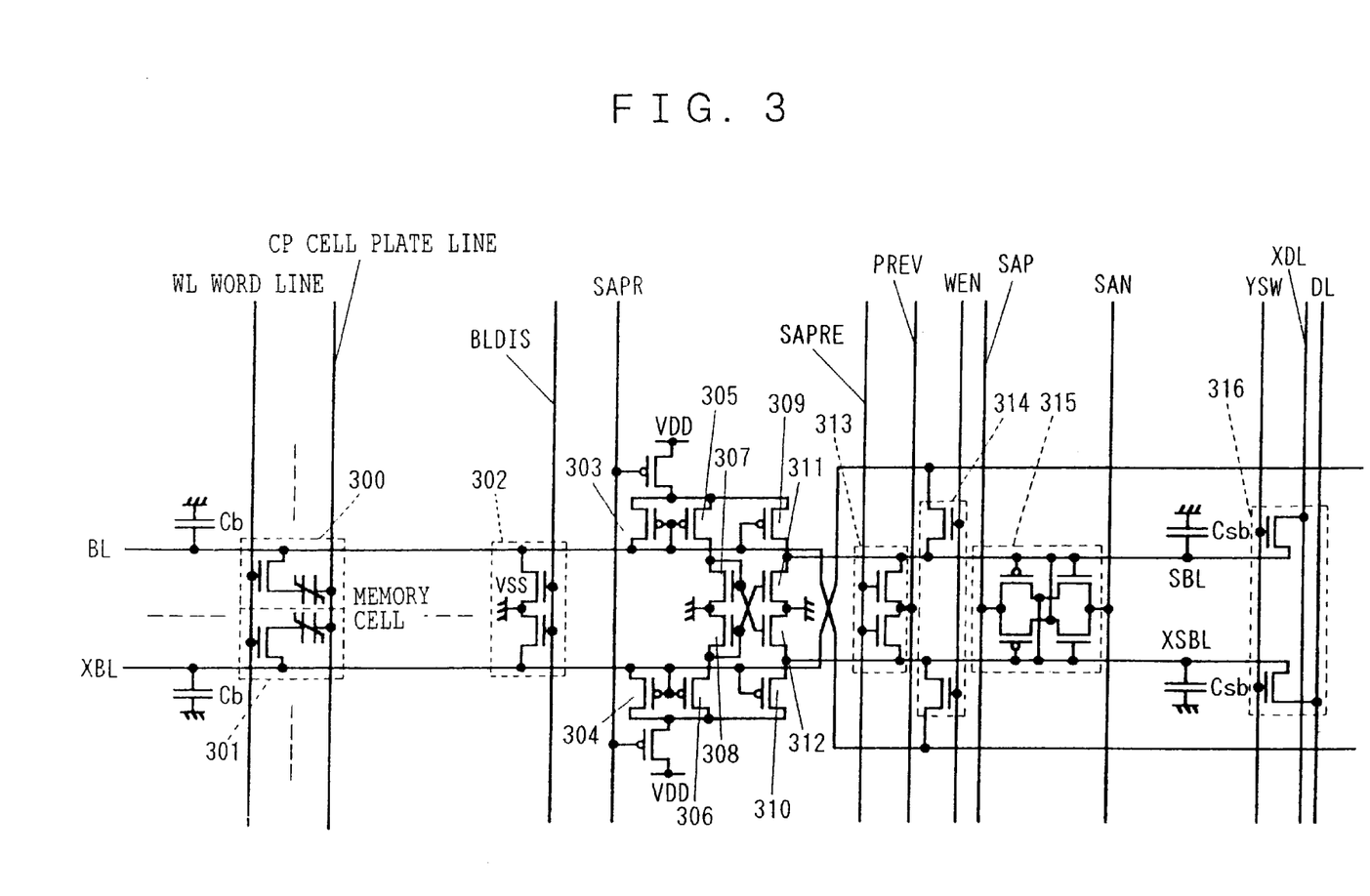
FIG. 3 is a circuit diagram showing a configuration of a ferroelectric memory according to Embodiment 2 of the present invention.

FIG. 3 is a circuit diagram showing an example of a configuration of a reading circuit in the ferroelectric memory according to Embodiment 2. In FIG. 3, reference numerals 300 and 301 denote 2T2C memory cells, reference character WL denotes a word line, reference characters BL and XBL denote bit lines, reference number 302 denotes a transistor for precharging the bit lines BL and XBL to VSS, reference numerals 303 and 304 denote precharge transistors, reference numerals 305 to 312 denote complementary current mirror amplifiers, reference characters SBL and XSBL denote sub bit lines, reference numeral 313 denotes a transistor for precharging the sub bit lines SBL and XSBL, reference numeral 315 denotes a second amplifier for amplifying the sub bit lines SBL and XSBL, reference numeral 316 denotes a bit line selecting switch, reference numeral 314 denotes a bit line writing transistor, reference characters Cb and Csb each denote parasitic capacitance of the bit lines BL and XBL and the sub bit lines SBL and XSBL.

Regarding the ferroelectric memory having the above configuration, the reading operation will be discussed.

Figure 4:
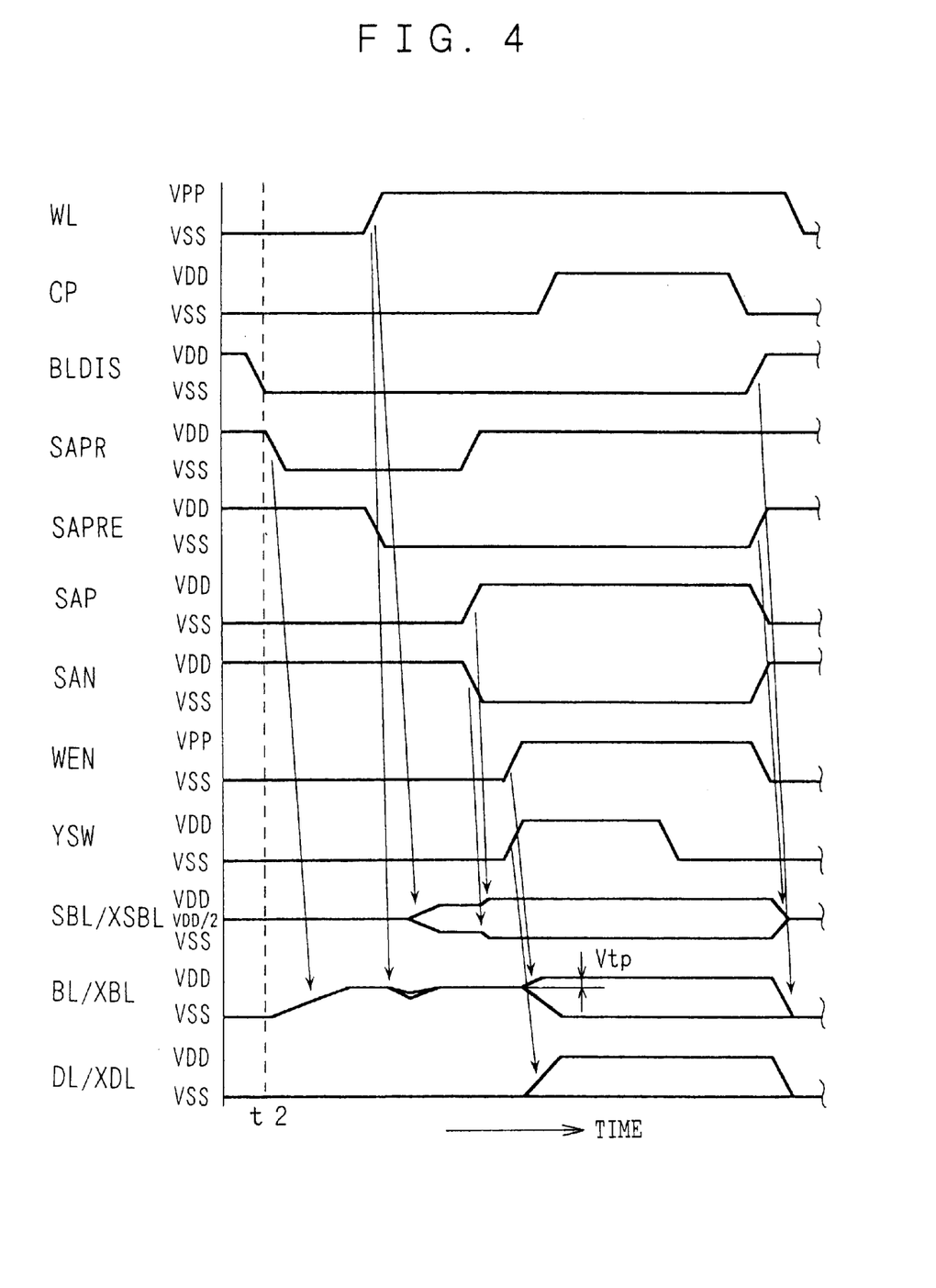
FIG. 4 is a timing chart showing a reading operation of Embodiment 2.

FIG. 4 is a timing chart of the reading operation in the ferroelectric memory of Embodiment 2.

BLDIS is deactivated at a timing of time t2, the bit line BL/XBL is brought to a floating state, SAPR is deactivated, and the bit line is precharged to a (VDD−Vtp) level. The complementary current mirror amplifiers 305 to 312 are activated simultaneously. After the bit line is precharged, SAPRE is deactivated and the sub bit line SBL/XSBL, which has been precharged to a (VDD/2) level, is brought to a floating state.

Subsequently, when WL is activated to a VPP level, the memory cell is selected. CP is at a VSS level at this moment, and a voltage of (VDD−Vtp) is applied to the ferroelectric capacitor.

It is assumed that the memory cell 300 stores Hi data and the memory cell 301 stores Low data. A charge quantity of {Cs*(VDD−Vtp)} is applied as charge current to the precharge transistor 303 because data stored in the memory cell 300 is Hi.

Meanwhile, since the memory cell 301 carries out a polarization inverting operation, a charge quantity of {2Pr+Cs*(VDD−Vtp)} is applied as charge current to the precharge transistor 304. Hence, current is applied to the activated complementary current mirror amplifiers 305 to 312 according to a mirror ratio n (n>0), and a potential of the sub bit line is represented by the following equations.

$Vsb=VDD/2$ $+n*\{Cs*(VDD-Vtp)\}/Csb$ $-n*\{2Pr+Cs*(VDD-Vtp)\}/Csb$ $=VDD/2-n*2Pr/Csb$ $Vxsb=VDD/2$ $-n*\{Cs*(VDD-Vtp))\}/Csb$ $+n*\{2Pr+Cs*(VDD-Vtp)\}/Csb$ $=VDD/2+n*2Pr/Csb$ A sub bit line potential difference is represented by the following equation.

$$Vdif=2*2Pr/Csb \quad (3)$$

And then, SAPR is activated to deactivate the precharge transistors 303 and 304 and the complementary current mirror amplifiers 305 to 312. SAP is activated to deactivate SAN. Hence, the second amplifier 315 is activated and a sub bit line potential is amplified.

The cell plate line CP is activated to a VDD level and WEN is activated to a VPP level, so that rewriting to the bit line is carried out. Subsequently, YSW is activated and reading data is outputted to the data line.

Additionally, since the Hi data of the memory cell 100 is not corrupted, rewriting is not necessary. Low data is rewritten to the memory cell 301, in which destructive reading occurs together with polarization inversion. When the output to the data line is completed after a desired period, YSW is deactivated.

And then, CP is deactivated to complete the rewriting, SAP is deactivated, SAN is activated, and the second amplifier is deactivated, SAPRE is activated to precharge the sub bit line to a (VDD/2) level.

WEN is deactivated, BLDIS is activated, and the bit line is precharged to a VSS level. After the bit line is precharged to VSS, the reading cycle is completed when WL is deactivated.

In Embodiment 2, since the precharge transistors 303 and 304 and the complementary current mirror amplifiers 305 to 312 are driven at VDD, a voltage applied to the ferroelectric capacitor is (VDD−Vtp). At the above precharge voltage, when an electric field applied to the ferroelectric capacitor is weaker than a coercive electric field, the precharge transistors 303 and 304 and the complementary current mirror amplifiers 305 and 312 are driven at a third potential higher than VDD, and the third potential is set so as to apply a voltage higher than (±Va) of FIG. 7 to the ferroelectric capacitor.

Further, in the above embodiment, the word line selects the memory cell after the bit line is precharged. The word line may select the memory cell before the bit line is precharged. In this case, since an operating margin is not necessary between the precharge of the bit line and the selection of the word line, a high-speed operation can be carried out. An output potential difference Vdif to the sub bit line is equal to that of Equation (3).

(Embodiment 3)

The following will discuss a ferroelectric memory according to Embodiment 3 of the present invention.

Figure 5:
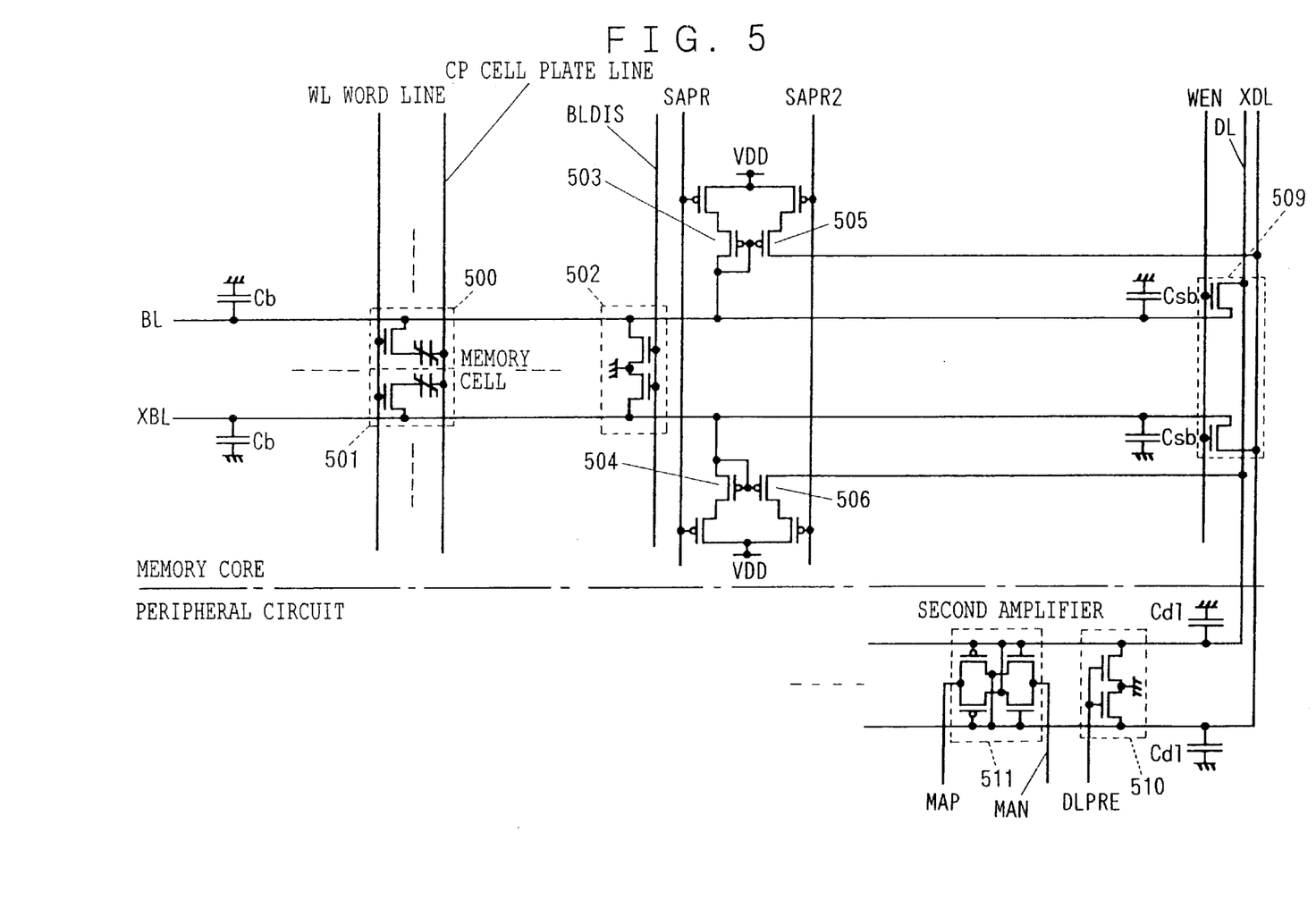
FIG. 5 is a circuit diagram showing a configuration of a ferroelectric memory according to Embodiment 3 of the present invention.

FIG. 5 is a circuit diagram showing an example of a configuration of a reading circuit in the ferroelectric memory of Embodiment 3. In FIG. 5, reference numerals 500 and 501 denote 2T2C memory cells, reference character WL denotes a word line, reference characters BL and XBL denote bit lines, reference numeral 502 denotes a transistor for precharging the bit lines BL and XBL to VSS, reference numerals 503 and 504 denote precharge transistors, reference numerals 505 and 506 denote current mirrors and data line output transistors, reference characters DL and XDL denote data lines, reference numeral 510 denotes a transistor for precharging the data lines DL and XDL to VSS, reference numeral 511 denotes a second amplifier for amplifying the data lines DL and XDL, reference numeral 509 denotes a bit line writing transistor, and reference characters Cb and Cdl each denote parasitic capacitance of the bit lines BL and XBL and the data lines DL and XDL.

Regarding the ferroelectric memory having the above configuration, a reading operation will be discussed.

Figure 6:
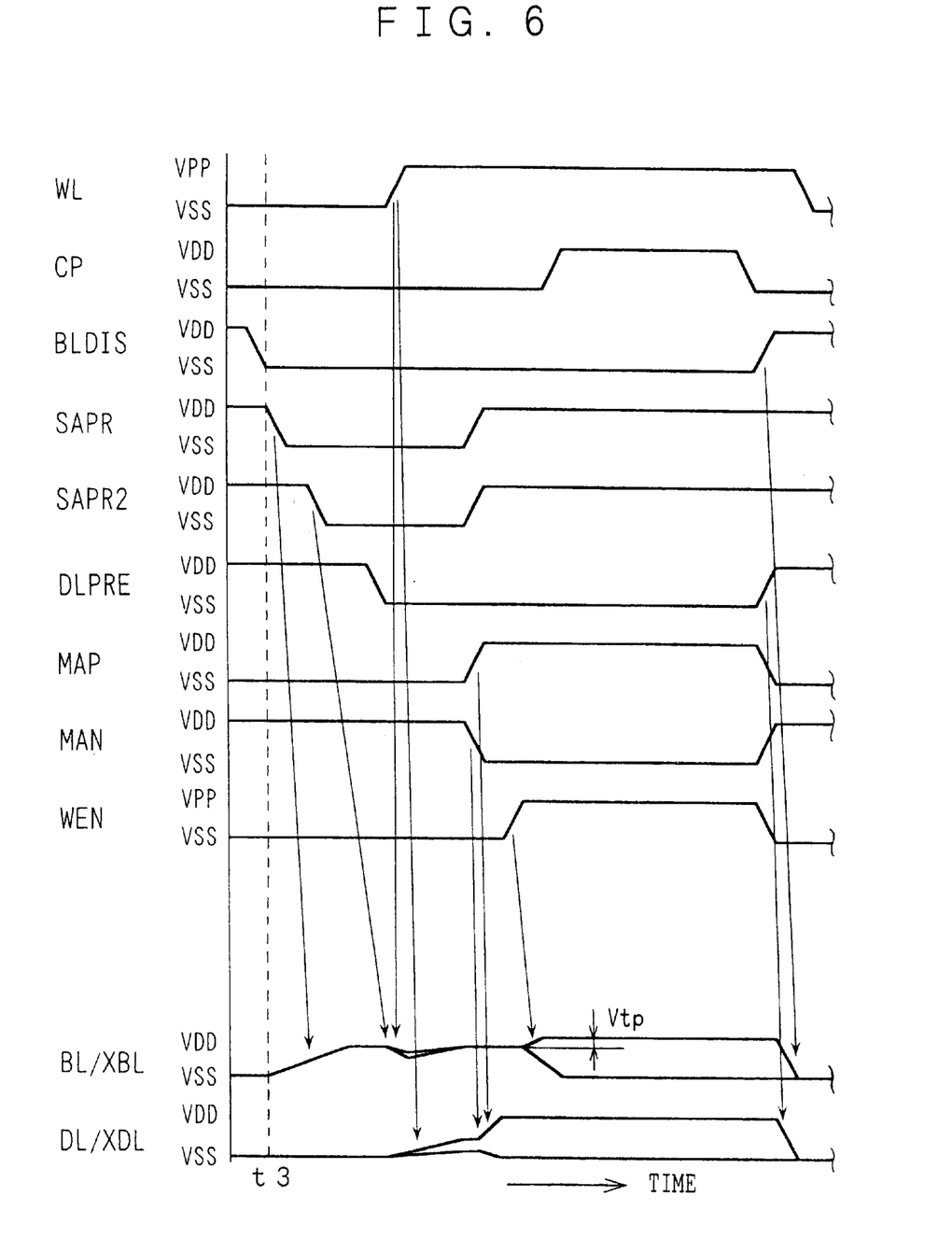
FIG. 6 is a timing chart showing a reading operation of Embodiment 3.

FIG. 6 is a timing chart of the reading operation in the ferroelectric memory of Embodiment 3.

BLDIS is deactivated at a timing of time t3 to bring the bit line BL/XBL to a floating state, SAPR is deactivated to precharge the bit line to a (VDD−Vtp) level. After the bit line is precharged, SAPR2 is deactivated to activate the current mirrors 505 and 506, and DLPRE is deactivated to bring the data line DL/XDL to a floating state.

When WL is activated to a VPP level, the memory cell is selected. CP is at a VSS level at this moment, and a voltage of (VDD−Vtp) is applied to the ferroelectric capacitor.

It is assumed that the memory cell 500 stores Hi data and the memory cell 501 stores Low data. A charge quantity of {Cs*(VDD−Vtp)} is applied as charge current to the precharge transistor 503 because the memory cell 100 stores Hi data.

Meanwhile, a charge quantity of {2Pr+Cs*(VDD−Vtp)} is applied as charge current to the precharge transistor 504 because the memory cell 501 performs a polarization inverting operation. Hence, a current is applied to the activated current mirrors 505 and 506 according to a mirror ratio n (n>0). A potential of the data line is represented by the following equations.

$$Vdl=n*\{Cs*(VDD-Vtp)\}/Cdl$$

$$Vxdl=n*\{2Pr+Cs*(VDD-Vtp)\}/Cdl$$

A data line potential difference is represented by the following equation.

$$Vdif=2Pr/Csl \quad (4)$$

Csb and a mirror ratio n are determined so as to satisfy (Vxdl≦VDD) at this moment.

Subsequently, SAPR and SAPR2 are activated, the precharge transistors 503 and 504 and the current mirrors 505 and 506 are deactivated, MAP is activated, and MAN is deactivated. Thus, the second amplifier 511 is activated and a data line potential is amplified.

The cell plate line CP is activated to a VDD level and WEN is activated to a VPP level so as to perform rewriting to the bit line BL/XBL. Here, since Hi data of the memory cell 500 is not corrupted, rewriting is not necessary. Low data is rewritten to the memory cell 501, in which destructive reading occurs together with polarization inversion.

And then, CP is deactivated to complete the rewriting, MAP is deactivated, MAN is activated, the second amplifier is deactivated, and DLPRE is activated to precharge the data line DL/XDL to a VSS level. WEN is deactivated, BLDIS is activated, and the bit line is precharged to a VSS level.

After the bit line BL/XBL is precharged to VSS, the reading cycle is completed when WL is deactivated.

According to Embodiment 3, the data line can be read directly, a high-speed operation is possible, and the sense amplifier includes only a PMOS current mirror. Hence, a smaller area can be achieved.

In the above-mentioned three embodiments, a PMOS input complementary current mirror amplifier and a PMOS current mirror are adopted. Needless to say, a similar reading operation can be performed in the following manner as well. A first potential is set higher than a threshold voltage of NMOS, a complementary current mirror amplifier with an NMOS input and an NMOS current mirror are provided instead of the complementary current mirror amplifier with a PMOS input and a PMOS current mirror. After the memory cell is selected by the word line, the cell plate line is activated, and the second precharge transistor and the NMOS input complementary current mirror amplifier or the NMOS current mirror are activated.

Moreover, the above-mentioned three embodiments adopt the memory cell having a 2T2C structure. Needless to say, a similar reading operation can be performed with a 1T1C memory cell regardless of whether a reference cell is made of ferroelectric or other dielectric material.

The above explanation described the embodiments of the present invention in a specific manner. The present invention is not limited to the above embodiments and can be modified within the range of the scope of the invention.

As described above, according to the present invention, amplification is performed on a difference in current which is applied from the bit line to the ferroelectric capacitor. Thus, regardless of a parallel plate capacitance component (Cs) of the ferroelectric capacitor, it is possible to read a maximum polarization charge quantity from the ferroelectric memory cell, thereby largely increasing a reading margin for a reading operation.

For this reason, in the even of deterioration on the ferroelectric forming the memory cell, it is possible to read data from the ferroelectric memory cell with stability, thereby improving the reliability of the device.

Also, it is possible to select a memory core with a high degree of freedom. The memory cell is not dependent on a bit line parasitic capacitance component (Cb)/Cs of the ferroelectric capacitor. Therefore, an embedded ferroelectric memory core can be obtained with a high degree of freedom of design.

Therefore, even when Cb/Cs of the ferroelectric capacitor is small, it is possible to positively read data from the ferroelectric memory cell, thereby improving the reliability of the device.

What is claimed is:

1. A ferroelectric memory for storing digital data comprising:
   a ferroelectric capacitor memory device;
   a selective transistor for selecting said capacitor;
   a ferroelectric memory cell in which a drain or a source of said selective transistor is connected to one of terminals of said ferroelectric capacitor;
   a word line connected to a gate of said selective transistor;
   a bit line connected to the drain or the source of said selective transistor, said drain or said source not being connected to said ferroelectric capacitor;
   a cell plate line connected to the other terminal of said ferroelectric capacitor;
   a first precharge transistor for precharging said bit line to a first potential;
   means for precharging said bit line to a second potential, said precharging means comprising a second precharge transistor coupled to said bit line to supply precharge current to said bit line while said word line selects said ferroelectric memory cell; and
   amplifying means for sensing and amplifying precharge current of said second precharge transistor to read data stored in said ferroelectric memory cell.

2. The ferroelectric memory according to claim 1, wherein said second precharge transistor is for precharging said bit line to the second potential before said word line selects said ferroelectric memory cell, said word line for selecting said ferroelectric memory cell thereafter, and said amplifying means for amplifying, based on the selection, a current applied to said ferroelectric memory cell from said bit line precharged to the second potential.

3. The ferroelectric memory according to claim 1, wherein said amplifying means is a complementary current mirror amplifier.

4. The ferroelectric memory according to claim 3, further comprising a sub bit line for applying an amplified current from said amplifying means, and a second amplifier for amplifying current of said sub bit line.

5. The ferroelectric memory according to claim 1, wherein said amplifying means is a complementary current mirror amplifier with a mirror ratio other than 1.

6. The ferroelectric memory according to claim 1, wherein said amplifying means is a current mirror amplifier.

7. The ferroelectric memory according to claim 1, wherein said amplifying means is a current mirror amplifier with a mirror ratio other than 1.0.

8. The ferroelectric memory according to claim 1, wherein said amplifying means is a current mirror amplifier, said ferroelectric memory further comprises data lines selectively connected to a plurality of bit lines and a second amplifier for amplifying a potential or a current of said data line, a drain of said transistor constituting said current mirror amplifier is connected to said data line, and said second amplifier is provided for each of said data lines.

9. The ferroelectric memory according to claim 1, wherein said second precharge transistor comprises a PMOS transistor whose gate and drain are connected to said bit line and whose source is connected to a source voltage.

10. The ferroelectric memory according to claim 1, wherein said second precharge transistor comprises a PMOS transistor whose gate and drain are connected to said bit line and whose source is connected to a third potential higher than a source voltage.

* * * * *